United States Patent
Saito et al.

(10) Patent No.: US 8,377,504 B2
(45) Date of Patent: Feb. 19, 2013

(54) METHOD FOR PRODUCING ELECTROCONDUCTIVE POLYMER ELECTRODE, AND DYE-SENSITIZED SOLAR CELL EQUIPPED WITH THE SAME

(75) Inventors: Yasuteru Saito, Kyoto (JP); Masashi Nakayama, Kyoto (JP)

(73) Assignee: Dai-Ichi Kogyo Seiyaku Co., Ltd., Kyoto (JP)

( * ) Notice: Subject to any disclaimer, the term of this patent is extended or adjusted under 35 U.S.C. 154(b) by 302 days.

(21) Appl. No.: 12/677,071

(22) PCT Filed: Sep. 10, 2008

(86) PCT No.: PCT/JP2008/066343
§ 371 (c)(1),
(2), (4) Date: Mar. 23, 2010

(87) PCT Pub. No.: WO2009/041269
PCT Pub. Date: Apr. 2, 2009

(65) Prior Publication Data
US 2011/0000527 A1    Jan. 6, 2011

(30) Foreign Application Priority Data
Sep. 26, 2007    (JP) .................................. 2007-249346

(51) Int. Cl.
*B05D 5/12*    (2006.01)
*H01L 31/18*    (2006.01)
*H01L 31/042*    (2006.01)

(52) U.S. Cl. ............ 427/74; 427/58; 136/252; 136/256; 136/263; 502/101; 252/500

(58) Field of Classification Search ............... 136/252, 136/256, 263; 193/280, 290.01; 427/58, 427/74; 502/101; 252/500
See application file for complete search history.

(56) References Cited

U.S. PATENT DOCUMENTS

| | | | | |
|---|---|---|---|---|
| 5,997,714 A | * | 12/1999 | Hamahara et al. ............ | 205/290 |
| 2004/0187917 A1 | * | 9/2004 | Pichler ........................... | 136/263 |
| 2006/0062983 A1 | * | 3/2006 | Irvin et al. .................... | 428/220 |
| 2007/0175510 A1 | * | 8/2007 | Morooka et al. .............. | 136/263 |

FOREIGN PATENT DOCUMENTS

| | | |
|---|---|---|
| EP | 0 615 256 | 9/1994 |
| JP | 2003-317814 | 11/2003 |
| JP | 2006-155907 | 6/2006 |
| JP | 2006-318770 | 11/2006 |
| JP | 2007-128757 | 5/2007 |

* cited by examiner

*Primary Examiner* — Douglas Mc Ginty
(74) *Attorney, Agent, or Firm* — Jordan and Hamburg LLP

(57) ABSTRACT

A method for producing an electroconductive polymer electrode that is excellent in electroconductivity and catalyst capability, is easily patterned, is high in use efficiency of a coating solution, and can produce conveniently with good reproducibility and productivity, and a dye-sensitized solar cell with an excellent conversion efficiency obtained by using the same are provided. Specifically, such a method is employed that a solution containing a monomer of an electroconductive polymer, a pyrrolidone compound represented by the following general formula (1) as a polymerization controlling agent and an oxidizing agent is coated on an electrode substrate, and then the monomer is polymerized by oxidation polymerization to form an electroconductive polymer electrode.

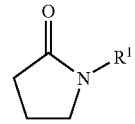

(1)

wherein in the formula (1), $R^1$ represents an alkyl group or an aryl group.

10 Claims, 1 Drawing Sheet

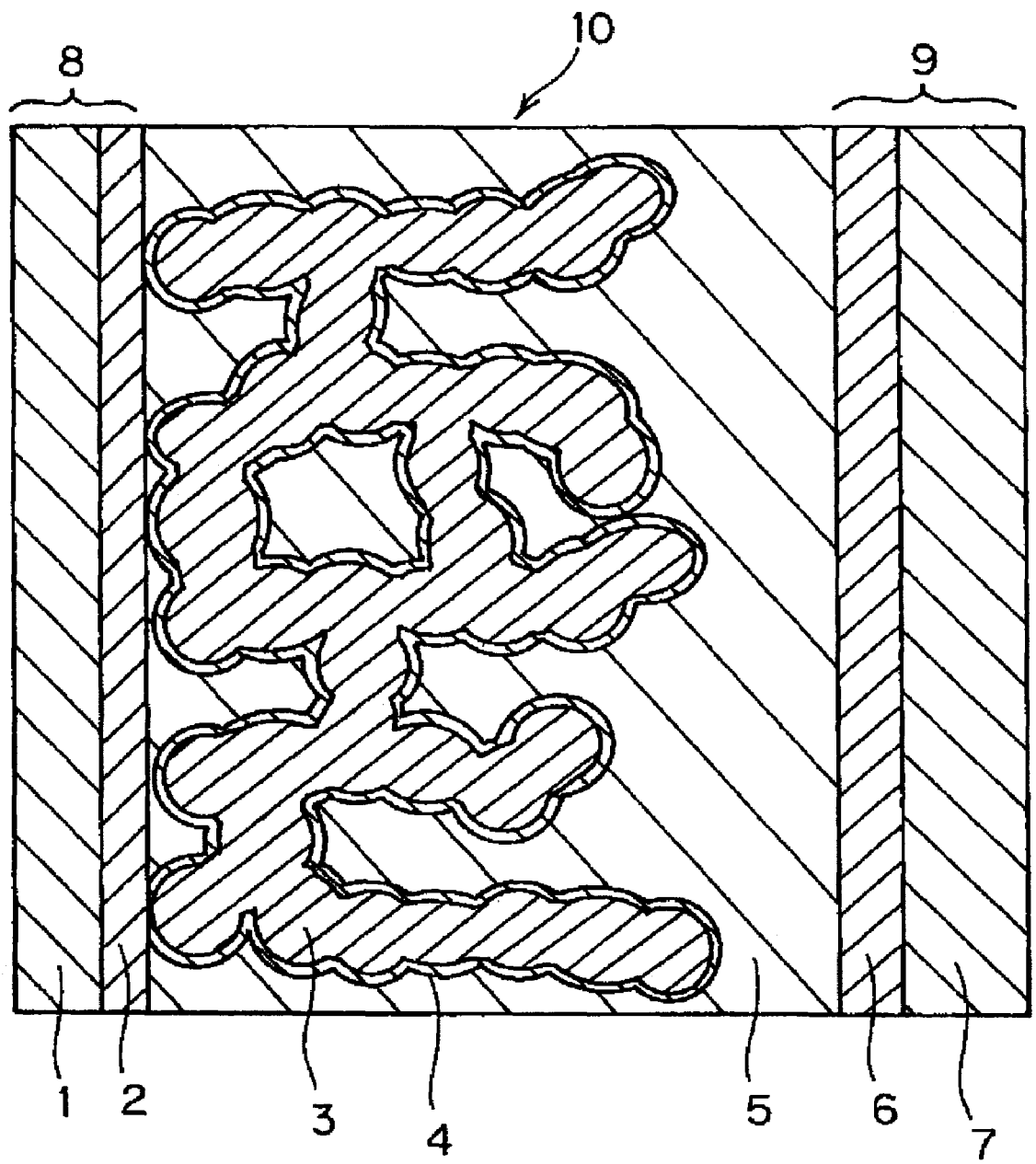

METHOD FOR PRODUCING ELECTROCONDUCTIVE POLYMER ELECTRODE, AND DYE-SENSITIZED SOLAR CELL EQUIPPED WITH THE SAME

BACKGROUND

This is the 35 U.S.C. §371 National Stage of PCT/JP2008/066343 filed Sep. 10, 2008.

The present invention relates to a method for producing an electroconductive polymer electrode, and a dye-sensitized solar cell equipped with the electroconductive polymer electrode.

In recent years, various kinds of solar cells have been proposed as a photoelectric conversion device converting light energy to electric energy. Among these, a dye-sensitized solar cell, which was introduced by M. Gratzel, et al. (Ecole Polytechnique Federale de Lausanne, Swiss) on 1991 (Nature, vol. 353, pp. 737-740 (1991)), is expected to be practiced owing to such advantages that the materials are inexpensive, and the solar cell can be produced in a relatively simple process.

A dye-sensitized solar cell is generally constituted by a semiconductor electrode having a photoelectric conversion layer containing a semiconductor in which a dye is absorbed on an electroconductive substrate, a counter electrode (catalyst electrode) containing an electroconductive substrate having a catalyst layer formed thereon provided to face the semiconductor electrode, and an electrolyte layer (charge transporting layer) retained between the semiconductor electrode and the counter electrode.

The catalyst electrode of the dye-sensitized solar cell is required to have such electrode characteristics that the reduction reaction of reducing an oxidant of a redox pair (for example, $I_3^-/I^-$) to a reductant (for example, the reduction reaction of reducing $I_3^-$ to $I^-$) proceeds immediately.

In general, examples of the catalyst electrode of the dye-sensitized solar cell include a platinum electrode, and examples of a production method thereof include a vapor deposition method, a sputtering method, and a method, in which a precursor of platinum is coated on an electrode by a dipping method, a spraying method or the like, and then heated.

However, platinum is an expensive noble metal, and in the case where a platinum electrode is produced by a vacuum deposition method or a sputtering method, a large loss of the material occurs to lower the productivity, and a vacuum equipment is necessarily provided to increase the equipment expenses, which brings about an increased production cost. Furthermore, it has been known that platinum that is vapor-deposited is dissolved in an iodine electrolytic solution in the presence of oxygen, and thus the use thereof involves a problem in safety. The dipping method and the spraying method are conveniently practiced since a vacuum equipment is not used, but the methods require baking at around 400° C. in the step subsequent to coating on the substrate, and thus involve such a problem that the methods cannot be applied to a substrate that is weak against heat, such as a resin substrate.

As a substitute of the platinum electrode, an electroconductive polymer catalyst electrode using poly(3,4-ethylenedioxythiophene) (which is hereinafter abbreviated as PEDOT) as an electroconductive polymer excellent in stability and electroconductivity has been reported.

Non-patent Document 1 discloses a dye-sensitized solar cell using an ionic liquid electrolyte and a PEDOT counter electrode. The document discloses a production method of the PEDOT counter electrode, in which such a process is repeated that a dispersion aqueous solution of particles of PEDOT having polystyrenesulfonic acid (PSS) as a dopant (which is hereinafter abbreviated as PEDOT-PSS) is formed into a film by spin-coating on electroconductive glass, and the film is dried and then heat-treated.

However, the electroconductive polymer catalyst electrode formed from the dispersion aqueous solution of PEDOT-PSS particles has low electroconductivity, and thus the capability thereof is lower than the platinum electrode in the case where an electrolytic solution containing an organic solvent is used.

Under the circumstances, Patent Document 1 discloses a dye-sensitized solar cell using a hole collecting electrode (catalyst electrode) formed of an organic film (PEDOT-PTS) formed simultaneously with polymerization of a monomer of PEDOT with p-toluenesulfonic acid (PTS) as a dopant. According to the document, a hole collecting electrode can be produced in a simple process at low cost as compared to a conventional method for forming a catalyst electrode, and a dye-sensitized solar cell can be provided with advantages in production process and production cost, while the solar cell maintains a cell capability that is equivalent to a dye-sensitized solar cell using a conventional catalyst electrode using platinum.

However, the PEDOT electroconductive polymer electrode disclosed in Patent Document 1 has a cell capability that is equivalent to a dye-sensitized solar cell using a conventional catalyst electrode using platinum, but the comparison is performed under a condition of a device conversion efficiency of approximately 5%, and it is unclear as to whether or not the cell can exhibit a comparable capability under a higher capability condition (i.e., a condition where a larger electric current flows). Furthermore, there is a description "an organic film formed simultaneously with polymerization of a monomer", but a desirable production method is not disclosed. The production method disclosed as an example for the hole collector is only a method of spin-coating a solution containing a monomer, and then polymerizing under heat treatment. The production process is complicated due to the use of a spin coating method, and thus is not necessarily sufficient as an industrial production method. In a spin coating method, patterning for forming devices is difficultly performed upon practical application, and the solution use efficiency is low in the coating operation.

In general, examples of a thin film coating method other than a spin coating method include a printing method, such as a screen printing method and a slit coating method. Upon applying the coating methods, in general, a binder, such as ethyl cellulose, is often added for enhancing the coating property and for enhancing the adhesiveness to a substrate. However, the counter electrode of the dye-sensitized solar cell necessarily has high electroconductivity, and the addition of an ordinary binder lowers the electroconductivity of the total electrode, whereby it is difficult to produce a counter electrode exhibiting sufficient capability with a system having a binder or the like added thereto.

The formation method of the PEDOT electroconductive polymer electrode disclosed in Patent Document 1 is a method disclosed in Patent Document 2, in which a polymerization controlling agent for reducing the polymerization rate is added to a solution containing a monomer and an oxidizing agent, which is formed into a film at room temperature where polymerization difficultly occur, and then subjected to reaction under heat, thereby forming an electroconductive polymer film. As the polymerization controlling agent, the use of imidazole, dimethylsulfoxide or the like has been reported. However, the polymerization reaction proceeds within several minutes to several hours at room temperature even though the polymerization controlling agent is used, and it is difficult to use the solution for a prolonged period of time, thereby providing a problem upon applying to a coating method requiring certain stability of a coating solution.

As having been described above, an electroconductive polymer counter electrode for a dye-sensitized solar cell is required to be excellent in patterning property, use efficiency of a coating solution, and coating reproducibility, and to be high in electroconductivity and catalyst capability, but it has been difficult to satisfy all the requirements.

Patent Document 1: JP-A-2003-317814
Patent Document 2: EP 0,615,256 A
Non-patent Document 1: The 72nd Meeting of Electrochemical Society of Japan, Abstract, p. 471 (2005)

SUMMARY OF THE INVENTION

The invention has been made in view of the aforementioned problems. An object of the invention is to provide a method for producing an electroconductive polymer electrode that is excellent in electroconductivity and catalyst capability, is easily patterned, is high in use efficiency of a coating solution, and can produce conveniently with good reproducibility and productivity, and a dye-sensitized solar cell obtained by using the same.

As a result of earnest investigations made by the inventors for solving the problems, it has been found that in a method of forming an electroconductive polymer thin film by coating a solution containing a monomer of an electroconductive polymer and an oxidizing agent on an electrode substrate and then subjecting to oxidation polymerization, a pyrrolidone compound represented by the following general formula (1) is used as a polymerization controlling agent in the solution, and the solution composition is appropriately controlled, whereby an electroconductive polymer electrode excellent in coating property, electroconductivity and catalyst capability can be produced with good reproducibility by using a coating method excellent in solution use efficiency, such as a screen printing method and the like, without addition of a binder.

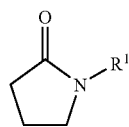

(1)

In the formula (1), $R^1$ represents an alkyl group or an aryl group.

Accordingly, a method for producing an electroconductive polymer electrode according to the invention contains steps of: coating a solution containing a monomer of an electroconductive polymer and an oxidizing agent on an electrode substrate and then polymerizing the monomer by oxidation polymerization to form an electroconductive polymer thin film, in which the solution contains a pyrrolidone compound represented by the general formula (1) as a polymerization controlling agent for solving the problems.

The pyrrolidone compound in the production method is preferably N-methyl-2-pyrrolidone.

A coating method in the production method is preferably a printing method, and particularly preferably a screen printing method.

A dye-sensitized solar cell according to the invention contains a semiconductor electrode having a photoelectric conversion layer, and a counter electrode facing the semiconductor electrode, in which the counter electrode is an electroconductive polymer electrode produced by the production method according to the invention.

The electroconductive polymer electrode in the dye-sensitized solar cell preferably has a sheet resistance of the electroconductive polymer thin film itself of 60Ω per square or less.

According to the invention, an electroconductive polymer electrode that is excellent in electrode performance and is easily patterned can be produced conveniently with good reproducibility and productivity. Furthermore, the use of the electroconductive polymer electrode provides a dye-sensitized solar cell excellent in conversion efficiency with good reproducibility.

BRIEF DESCRIPTION OF THE DRAWING

The drawing is a schematic cross sectional view showing a basic structure of an embodiment of a dye-sensitized solar cell according to the invention.

DETAILED DESCRIPTION OF THE INVENTION

The best mode for carrying out the invention will be described in detail below with reference to the drawing.

The drawing is a schematic cross sectional view showing an example of the dye-sensitized solar cell according to the invention. In the drawing, numeral 1 denotes a transparent substrate, 2 denotes a transparent electroconductive film, 3 denotes a porous metallic oxide semiconductor layer, 4 denotes a sensitizing dye layer, 5 denotes a electrolyte layer, 6 denotes an electroconductive polymer thin film, 7 denotes an electrode substrate that supports the electroconductive polymer thin film 6, 8 denotes a working electrode substrate containing the transparent substrate 1 and the transparent electroconductive film 2, and 9 denotes an electroconductive polymer electrode (counter electrode).

As shown in the drawing, the porous metallic oxide semiconductor layer 3 is formed on the surface of the working electrode substrate 8 containing the transparent substrate 1 and the transparent electroconductive film 2 formed thereon, and the sensitizing dye layer 4 having a sensitizing dye adsorbed is formed on the surface of the porous metallic oxide semiconductor layer 3. The electroconductive polymer electrode 9 according to the invention having such a structure that the electroconductive polymer thin film 6 is formed on the surface of the electrode substrate 7 is provided to face the assembly with the electrolyte layer 5 intervening therebetween.

Preferred embodiments of the constitutional materials of the dye-sensitized solar cell of the invention will be described below.

[Transparent Substrate]

The transparent substrate 1 constituting the working electrode substrate 8 may be one that transmits visible light, and transparent glass can be preferably used. Glass having a surface processed to scatter incident light and translucent glass in the form of frosted glass may also be used. In addition to glass, one that transmits light, such as a plastic plate and a plastic film, may also be used.

The thickness of the transparent substrate 1 is not particularly limited since it varies depending on the shape and the use condition of the solar cell, and for example, in the case where glass or plastics are used, the thickness may be approximately from 1 mm to 1 cm taking the durability upon actual use into consideration, and is preferably approximately from 1 μm to 1 mm in the case where flexibility is required, and a plastic film is used.

[Transparent Electroconductive Film]

The transparent electroconductive film 2 may be one that transmits visible light and has electroconductivity, and examples of a material therefor include a metallic oxide. While not limiting, tin oxide doped with fluorine (which is hereinafter abbreviated as "FTO"), indium, oxide, a mixture of tin oxide and indium oxide (which is hereinafter abbreviated as "ITO"), zinc oxide and the like are preferably used. An opaque electroconductive material may be used in the case where the material transmits visible light through such a process as dispersion. Examples of the material include a carbon material and a metal. While not limiting, examples of the carbon material include graphite, carbon black, glassy carbon, carbon nanotubes and a fullerene compound. While not limiting, examples of the metal include platinum, gold, silver, ruthenium, copper, aluminum, nickel, cobalt, chromium, iron, molybdenum, titanium, tantalum and alloys thereof.

Accordingly, the transparent electroconductive film 2 can be formed by providing a film of an electroconductive material containing at least one of the aforementioned electroconductive materials on the surface of the transparent substrate 1. In alternative, the aforementioned electroconductive material may be integrated into the material constituting the transparent substrate 1, thereby forming the working electrode substrate 8 by integrating the transparent substrate and the transparent electroconductive film.

Examples of the method for forming the transparent electroconductive film 2 on the transparent substrate 1 include a liquid phase method, such as a sol-gel method, a gas phase method, such as sputtering and CVD, and a method of coating of a dispersed paste, in the case where a metallic oxide is used. In the case where an opaque electroconductive material is used, examples of the method include a method of binding a powder material or the like with a transparent binder.

Examples of the method for integrating the transparent substrate and the transparent electroconductive film include a method of mixing the aforementioned electroconductive film material as an electroconductive filler upon forming the transparent substrate.

The thickness of the transparent electroconductive film 2 is not particularly limited since the materials used vary in electroconductivity, and is from 0.01 μm to 5 μm, and preferably from 0.1 μm to 1 μm, for glass having an FTO film, which is ordinarily used. The required electroconductivity varies depending on the area of the electrode used and the electric current flowing in the solar cell device, and is demanded to be lower resistance when the electrode area is larger, and the electric current flowing the device is larger, and the electroconductivity is generally 100Ω per square or less, preferably 10Ω per square or less, and more preferably 5Ω per square or less.

The thickness of the working electrode substrate 8 constituted by the transparent substrate and the transparent electroconductive film or the working electrode substrate 8 formed by integrating the transparent substrate and the transparent electroconductive film is not particularly limited since it varies depending on the shape and the use condition of the solar cell as described above, and is generally approximately from 1 μm to 1 cm.

[Porous Metallic Oxide Semiconductor]

While not limiting, examples of the porous metallic oxide semiconductor 3 include titanium oxide, zinc oxide and tin oxide, and titanium dioxide, particularly anatase titanium oxide, is preferred. The amount of the grain boundary of the metallic oxide is preferably smaller for decreasing the electric resistance. The semiconductor layer preferably has a larger specific surface area for adsorbing a larger amount of the sensitizing dye, and specifically is preferably from 10 to 200 $m^2/g$. Furthermore, for increasing the light absorption amount of the sensitizing dye, the particle size distribution of the oxide used is preferably expanded for scattering light.

The porous metallic oxide semiconductor can be provided on the transparent electroconductive film 2 by a known method. Examples thereof include a sol-gel method, a method of coating of a dispersed paste, and a method of electrodeposition or electrocoating.

The thickness of the semiconductor layer is not particularly limited since the optimum value thereof varies depending on the oxide used, and may be from 0.1 μm to 50 μm, and preferably from 5 to 30 μm.

[Sensitizing Dye]

The sensitizing dye layer 4 may be one capable of injecting electron to the metallic oxide semiconductor layer 3 through excitation with sunlight, and a dye having been ordinarily used in a dye-sensitized solar cell may be used. For enhancing the photoelectric conversion efficiency of the device, such a one is preferred that has an absorption spectrum overlapping the sunlight spectrum in a broad wavelength range and has high light resistance. While not limiting, a ruthenium complex, particularly a ruthenium polypyridine complex, is preferred, and a ruthenium complex represented by the formula $Ru(L)_2(X)_2$ is more preferred. In the formula, L represents 4,4'-dicarboxy-2,2'-bipyridine or a quaternary ammonium salt thereof, or a polypyridine ligand having a carboxyl group introduced thereto, and X represents SCN, Cl or CN. Examples thereof include bis(4,4'-dicarboxy-2,2'-bipyridine) diisothiocyanate ruthenium complex. Other examples of the dye include a metal complex dye other than ruthenium, such as an iron complex, a copper complex and an osmium complex. Examples thereof further include organic dyes, such as a cyan dye, a porphyrin dye, a polyene dye, a coumarin dye, a cyanine dye, a squalene dye, a styryl dye, an eosin dye and an indoline dye. The dye preferably has a bonding group bonded to the metallic oxide semiconductor layer for enhancing the electron injection efficiency to the metallic oxide semiconductor layer. While not limiting, the bonding group is preferably a carboxyl group, a sulfonic acid group, a hydroxyl group or the like.

Examples of a solvent for dissolving the dye include an alcohol compound, such as ethanol, a nitrogen compound, such as acetonitrile, a ketone compound, such as acetone, an ether compound, such as diethyl ether, a halogenated aliphatic hydrocarbon, such as chloroform, an aliphatic hydrocarbon, such as hexane, an aromatic hydrocarbon, such as benzene, and an ester compound, such as ethyl acetate. The dye concentration in the solution can be appropriately controlled depending on the kinds of the dye and solvent used, and is preferably a high concentration to some extent for adsorbing the dye onto the surface of the semiconductor sufficiently. For example, a concentration of $4 \times 10^{-5}$ mol/L or more is preferred.

Examples of the method for adsorbing the sensitizing dye 4 to the porous metallic oxide semiconductor 3 is not particularly limited, and examples thereof include a method of immersing the electrode substrate having the porous metallic oxide semiconductor 3 formed thereon into a solution containing the dye dissolved therein at room temperature and under atmospheric conditions. The period of time of immersion is preferably controlled appropriately to form a monomolecular film of the dye homogeneously on the semiconductor layer depending on the kinds of the semiconductor, dye and solvent used and the concentration of the dye. The immersion may be performed under heating for executing adsorption efficiently.

[Electrolyte Layer]

The electrolyte layer 5 contains a supporting electrolyte, a redox pair capable of reducing the oxidized sensitizing dye, and a solvent capable of dissolving them. The redox pair constituting the electrolyte layer 5 is not particularly limited as far as it can be ordinarily used in a cell, a solar cell and the like, and examples thereof include a combination of a halogen diatomic molecule and a halide salt, a combination of a thiocyanate anion and two molecules of thiocyanic acid, and an organic redox pair, such as a polypyridylcobalt complex and hydroquinone. Among these, a combination of an iodine molecule and an iodide is preferred. The concentration of the redox pair is generally from 0.1 to 10 mol/L, and more preferably from 0.1 to 5 mol/L.

The solvent used in the electrolyte is not particularly limited as far as it can dissolve the redox pair, and can be arbitrarily selected from a nonaqueous organic solvent, an ambient temperature molten salt, water, a protonic organic solvent and the like. Examples of the organic solvent include a nitrile compound, such as acetonitrile, methoxyacetonitrile, valeronitrile and 3-methoxypropionitrile, a lactone compound, such as γ-butyrolactone and valerolactone, a carbonate compound, such as ethylene carbonate and propylene carbonate, an ether compound, such as dioxane, diethyl ether and ethylene glycol dialkyl ether, an alcohol compound, such as methanol and ethanol, dimethylformamide, and an imidazole compound, and among these, acetonitrile, valeronitrile, methoxypropionitrile, propylene carbonate, γ-butyrolactone and the like are preferably used. These may be used solely or after mixing two or more kinds thereof.

An ionic liquid, i.e., a molten salt, may be used as the solvent. As the ionic liquid, those that can be ordinarily used in known cell and solar cell disclosed in Inorg. Chem., vol. 35, pp 1168-1178 (1996), Electrochemistry, vol. 2, pp. 130-136 (2002), JP-T-9-507334, JP-A-8-259543 and the like may be used without limitation, and a salt having a melting point lower than room temperature (25° C.) and a salt having a melting point higher than room temperature but is in a liquid state at room temperature by dissolving another molten salt or an additive other than molten salt therein are preferably used.

Specific examples of a cation of the molten salt include ammonium, imidazolium, oxazolium, thiazolium, oxadiazolium, triazolium, pyrrolidinium, pyridinium, piperidinium, pyrazolium, pyrimidinium, pyrazinium, triazinium, phosphonium, sulfonium, carbazolium, indolium and derivatives thereof, and ammonium, imidazolium, pyridinium, piperidinium, pyrazolium and sulfonium are particularly preferred.

Examples of an anion of the molten salt include a metallic chloride, such as $AlCl_4^-$ and $Al_2Cl_7^-$, a fluorine-containing compound, such as $PF_6^-$, $BF_4^-$, $CF_3SO_3^-$, $N(CF_3SO_2)_2^-$, $N(F_2SO_2)_2^-$, $F(HF)_n^-$ and $CF_3COO^-$, a non-fluorine compound, such as $NO_3^-$, $CH_3COO^-$, $C_6H_{11}COO^-$, $CH_3OSO_3^-$, $CH_3OS_2^-$, $CH_3SO_3^-$, $CH_3SO_2^-$, $(CH_3O)_2PO_2^-$, $SCN^-$, $N(CN)_2^-$ and $B(CN)_4^-$, and a halogenide, such as an iodide and a bromide.

The electrolyte layer may further contain a supporting electrolyte, for example, a lithium salt, an imidazolium salt and a quaternary ammonium salt, and an additive, for example, a base, such as t-butylpyridine and N-methylbenzimidazole, a thiocyanate compound, such as guanidine thiocyanate, and water. The concentration of the additive is not particularly limited since the optimum concentration varies depending on the solvent, semiconductor electrode and dye used, and is preferably approximately from 1 mmol/L to 5 mol/L.

[Electroconductive Polymer Electrode—Electrode Substrate]

The electroconductive polymer electrode (counter electrode) 9 has such a structure that the electroconductive polymer thin film 6 is provided on the surface of the electrode substrate 7.

In the case where the electrode substrate 7 is used as both a support and a collector of the electroconductive polymer electrode, the electrode substrate 7 necessarily has electroconductivity at least on the surface of the electrode substrate, on which the electroconductive polymer thin film is to be formed.

Preferred examples of the material include a metal, a metallic oxide, a carbon material and an electroconductive polymer that have electroconductivity. Examples of the metal include platinum, gold, silver, ruthenium, copper, aluminum, nickel, cobalt, chromium, iron, molybdenum, titanium, tantalum and alloys thereof. The carbon material is not particularly limited, and examples thereof include graphite, carbon black, glassy carbon, carbon nanotubes and a fullerene compound. The metallic oxide, such as FTO, ITO, indium oxide and zinc oxide, is preferably used since in the case where the metallic oxide is used, the incident light amount can be increased since it is transparent or translucent.

An insulating material, such as glass and plastics, may be used as long as at least the surface of the electrode substrate can be processed to have electroconductivity. Examples of the method of processing to impart electroconductivity to an insulating material include a method of covering a part or the whole of the surface of the insulating material with the electroconductive material, also include, in the case where, for example, a metal is used, a solution method, such as plating and deposition, and a gas phase method, such as sputtering and vapor deposition, and further include, in the case where a metallic oxide is used, a sol-gel method. Examples of the method also include a method of mixing the insulating material with one kind or two or more kinds of powder or the like of the electroconductive material.

In the case where a electroconductive polymer is used as the electroconductive material, the electroconductive polymer described later may be coated on the substrate by the coating method described and subjected to chemical polymerization or the like, thereby forming an electroconductive polymer thin film layer. In this case, the electroconductive polymer thin film layer functions by itself as both the collector and the catalyst.

The shape of the electrode substrate 7 is not particularly limited since it can be modified depending on the shape of the solar cell in which it is used as the electroconductive polymer electrode, and may be a plate shape or a film shape capable of being warped. The electrode substrate may be transparent or opaque and is preferably transparent or translucent since the incident light amount to the sensitizing dye layer can be increased, and in some cases, the design property can be enhanced. As the electrode substrate, glass with an FTO film, a PET film with an ITO film and a PEN film with an ITO film are generally used, and since the materials used are different from each other in electroconductivity, the thickness of the electroconductive film on the electrode substrate is not particularly limited. For example, the thickness may be from 0.01 μm to 5 μm, and preferably from 0.1 μm to 1 μm, for the glass with an FTO film. The required electroconductivity varies depending on the area of the electrode used and the electric current flowing in the solar cell device, and is demanded to be lower resistance when the electrode area is larger, and the electric current flowing the device is larger, and the electroconductivity is generally 100Ω per square or less, preferably 10Ω per square or less, and more preferably 5Ω per square or less.

The thickness of the electrode substrate 7 is not particularly limited since it varies depending on the shape and the use condition of the solar cell as described above, and is generally approximately from 1 μm to 1 cm.

[Electroconductive Polymer Electrode—Electroconductive Polymer Thin Film]

The electroconductive polymer thin film 6 of the electroconductive polymer electrode (catalyst electrode) of the invention functions as a catalyst reducing the oxidant of the redox pair contained in the electrolyte layer.

The monomer that forms the electroconductive polymer substance is not particularly limited, and may be a known substance, and the substance is preferably formed in a porous state, thereby performing electron transfer reaction efficiently.

The monomer may be used solely or in combination of two or more kinds thereof.

Specific examples of the monomer used include a thiophene compound represented by the following general formula (2).

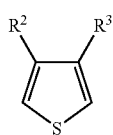

(2)

In the formula (2), $R^2$ and $R^3$ each independently represent a hydrogen atom, an alkyl group and an alkoxy group each having from 1 to 8 carbon atoms, an aryl group having from 6 to 12 carbon atoms, a cyano group, a thiocyano group, a halogen group, a nitro group, an amino group, a carboxyl group, a sulfo group or a phosphonium group, and $R^2$ and $R^3$ may be bonded to form a ring.

Among the compounds, thiophene, tetradecylthiophene, isothianaphthene, 3-phenylthiophene, 3,4-ethylenedioxythiophene and the like are preferably used, and 3,4-ethylenedioxythiophene is particularly preferably used.

One kind or two or more kinds of the thiophene compound may be used for forming the electroconductive polymer thin film.

The monomer used for forming the electroconductive polymer thin film preferably exhibits an electroconductivity of the polymerized film of $10^{-9}$ S/cm or more, more preferably 1 S/cm or more, and particularly preferably 400 S/cm or more.

A dopant may be added to the electroconductive polymer thin film for increasing the electroconductivity. The dopant is not particularly limited, and a known material may be used. Specific examples of the dopant include a halogen anion, such as iodine, bromine and chlorine, a halogenide anion, such as hexafluorophosphorus, hexafluoroarsenic, hexafluoroantimony, tetrafluoroboron and perchloric acid, an alkyl-substituted organic sulfonic acid anion, such as methanesulfonic acid and dodecylsulfonic acid, a cyclic sulfonic acid anion, such as camphorsulfonic acid, an alkyl-substituted or unsubstituted benzenemonosulfonic or benzenedisulfonic acid anion, such as benzenesulfonic acid, p-toluenesulfonic acid, o-toluenesulfonic acid, dodecylbenzenesulfonic acid and benzenedisulfonic acid, an alkyl-substituted or unsubstituted anion of naphthalenesulfonic acid having from 1 to 3 sulfonic acid groups substituted, such as 2-naphthalenesulfonic acid and 1,7-naphthalenedisulfonic acid, an alkyl-substituted or unsubstituted biphenylsulfonic acid anion, such as anthracenesulfonic acid, anthraquinonesulfonic acid, alkylbiphenylsulfonic acid and biphenyldisulfonic acid, a substituted or unsubstituted aromatic sulfonic acid anion, a boron compound anion, such as boron bissalicylate and boron biscatecholate, and molybdophosphoric acid. Among these, p-toluenesulfonic acid, o-toluenesulfonic acid, dodecylbenzenesulfonic acid and the like are preferably used. The dopant may be used solely or in combination of two or more kinds thereof.

For preventing the dopant from being released, an organic anion is preferred rather than an inorganic anion, and is preferably hard to suffer thermal decomposition.

The amount of the dopant used in the electroconductive polymer thin film is not particularly limited since the optimum value varies depending on the species of the dopant used, and is preferably from 5 to 60% by weight, and more preferably from 10 to 45% by weight.

The dopant may be present along with the monomer of the electroconductive polymer upon forming the electroconductive polymer thin film.

[Electroconductive Polymer Thin Film—Formation of Electroconductive Polymer Thin Film]

In the invention, a solution containing the monomer of the electroconductive polymer is coated on the electrode substrate 7, and then subjected to oxidation polymerization (i.e., in-situ polymerization), thereby forming the electroconductive polymer thin film 6. The oxidation polymerization method is such a chemical polymerization method that a monomer is polymerized by chemically oxidizing with an oxidizing agent.

Examples of the oxidizing agent used in the oxidation polymerization method include a halogenide compound, such as iodine, bromine, bromine iodide, chlorine dioxide, iodic acid, periodic acid and subchloric acid, a metal halogenide, such as antimony pentafluoride, phosphorus pentachloride, phosphorus pentafluoride, aluminum chloride and molybdenum chloride, a high atomic valence metallic salt, such as a permanganate salt, a bichromate salt, chromic anhydride, a ferric salt and a cupric salt, a protonic acid, such as sulfuric acid, nitric acid and trifluoromethanesulfuric acid, an oxygen compound, such as sulfur trioxide and nitrogen dioxide, a peroxoacid or a salt thereof, such as hydrogen peroxide, ammonium persulfate and sodium perborate, and a heteropolyacid or a salt thereof, such as molybdophosphoric acid, tungstophosphoric acid and tungstomolybdophosphoric acid, at least one kind of which may be used. Among these, a high atomic valence metallic salt, such as iron(III) tris-p-toluenesulfonate, is preferably used since the electroconductive polymer thin film formed has high electroconductivity.

In the chemical polymerization method, when the oxidizing agent is acted in the solution containing the electroconductive monomer, the resulting polymer is in a particle form or a massive form, which is difficult to be formed into the electrode shape, and therefore, as a method for producing the electroconductive polymer thin film electrode having high homogeneity, such a method is used that a polymerization controlling agent for reducing the polymerization rate is added to the solution containing the monomer and the oxidizing agent, which is formed into a film at room temperature where polymerization difficultly occur, and then subjected to reaction under heat, thereby forming the porous electroconductive polymer film. In the invention, a pyrrolidone compound represented by the following general formula (1) is used as a polymerization controlling agent.

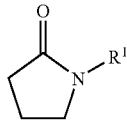

(1)

In the formula (1), $R^1$ represents an alkyl group or an aryl group.

In the pyrrolidone compound, N-methyl-2-pyrrolidone is preferably used.

The electroconductive polymer thin film electrode can also be formed in such a manner that the electrode substrate is immersed in a solution containing one of the aromatic compound monomer and the combination of the oxidizing agent and the polymerization controlling agent, or the solution is coated thereon, and then the electrode substrate is immersed in a solution containing the other component, or the solution is coated thereon, followed by performing polymerization under heating on the surface of the electrode substrate.

The coating method in the invention is not particularly limited, and from the standpoint of productivity and production cost, a method with high solution use efficiency, such as a printing method, is preferably used.

The term "use efficiency of solution" referred herein is a ratio of the total solution amount (A) used for coating and the amount obtained by subtracting the solution amount (B) that is lost in the coating process and cannot be used for forming the film from the total amount. Accordingly, the solution use efficiency E (%) is shown by the expression:

$$E=((A-B)/A)\times100$$

The spin coating method, which is often used as a method for forming an electroconductive polymer film, exhibits a solution use efficiency of 10% or less, and thus causes large loss of the solution in the coating process.

Examples of a coating method that exhibits high solution use efficiency include a printing method, a slit coater method, a bar coating method, a blade coating method, an air knife coating method, a gravure coating method, a roll coating method, a spray coating method and a dip coating method. Among these, a printing method is preferred since the apparatus therefor is in expensive, and patterning can be easily performed. Examples of the printing method include, screen printing, anastatic printing, copperplate printing, offset printing, surface printing, anastatic reverse offset printing, gravure printing, ink-jet printing, tampon printing and flexographic printing, and among these, screen printing is particularly preferred.

In the solution used in the coating operation in the invention, the monomer concentration of the electroconductive polymer in the solution is preferably from 1 to 10% by weight, and more preferably from 4 to 7% by weight. When the concentration exceeds 10% by weight or is less than 1% by weight, the dye-sensitized solar cell obtained by using the electroconductive polymer thin film may be somewhat decreased in conversion efficiency in some cases.

In the solution used in the coating operation in the invention, the concentration of the oxidizing agent in the solution is preferably from 10 to 70% by weight, and particularly in the case where a coating method that requires a certain solution viscosity, such as a screen printing method, is used, the concentration of the oxidizing agent is particularly preferably from 40 to 60% by weight.

The solvent for dissolving and mixing the monomer, the oxidizing agent and the polymerization controlling agent is not particularly limited as far as it dissolves the compounds used but does not dissolve the electrode substrate and the polymerized product, examples of which include an alcohol compound, such as methanol, ethanol, propanol and n-butanol, and water, and among these, a solvent having high boiling point and high viscosity, such as n-butanol, is preferably used.

The mixing ratio of the monomer, the oxidizing agent and the additive varies depending on the compounds used and the target polymerization degree and polymerization rate, and as the mixing ratios, the molar ratio of monomer/oxidizing agent is preferably from 1/0.3 to 1/10, and the molar ratio of oxidizing agent/polymerization controlling agent is preferably from 1/0.05 to 1/4. While changing by the mixing ratio, there is a tendency that when the amount of the polymerization controlling agent is too small, the polymerization proceeds quickly at room temperature, which provide a tendency of lowering the electroconductivity of the resulting thin film. When the amount of the polymerization controlling agent is too large, the polymerization does not proceed even under heating, thereby failing to provide the target electroconductive polymer thin film.

The heating condition upon subjecting the mixed solution to thermal polymerization after coating varies depending on the kinds of the monomer, polymerization catalyst and additive used, the mixing ratio and the concentration thereof, and the coating film thickness, and as the preferred condition, the heating temperature is from 25° C. to 120° C., and the heating time is from 1 minute to 12 hours, upon heating in the air.

The thickness of the electroconductive polymer thin film in the electroconductive polymer electrode of the invention is not limited since the optimum value varies depending on the purpose and the monomer used, and is preferably from 10 nm to 2 μm, and particularly preferably from 100 nm to 1 μm, from the standpoint of capability and cost.

Thus, the electroconductive polymer thin film 6 is formed on the electrode substrate 7, thereby providing the electroconductive polymer electrode 9.

After preparing the constitutional materials having been described above, the metallic oxide semiconductor electrode and the electroconductive polymer electrode are assembled with the electrolyte intervening therebetween by a conventionally known method to complete the dye-sensitized solar cell.

EXAMPLE

The invention will be described in more detail with reference to examples below, but the invention is not limited thereto.

Example 1

Production of Porous Metallic Oxide Semiconductor

On a working electrode substrate 8 formed by vapor-depositing a transparent electroconductive film 2 formed of fluorine-doped $SnO_2$ on a transparent substrate 1 formed of glass, a porous metallic oxide semiconductor layer 3 was formed in the following manner.

On the surface of FTO glass (produced by Nippon Sheet Glass Co., Ltd., sheet resistance: ≦10Ω per square) as the working electrode substrate 8, a commercially available titanium oxide paste (TSP-18NR, a trade name, produced by Catalysts and Chemicals, Ltd., particle size: 20 nm) was coated on the side of the transparent electroconductive film 2 to a thickness of approximately 10 μm and an area of approximately 5 mm×10 mm by a screen printing method, and a commercially available titanium oxide paste (TSP-400C, a trade name, produced by Catalysts and Chemicals, Ltd., particle size: 400 nm) was further coated thereon to a thickness of approximately 5 μm and the same area, which were baked at 500° C. in the air for 30 minutes. As a result, a titanium oxide film (porous metallic oxide semiconductor film 3) having a thickness of approximately 15 μm was obtained.

[Adsorption of Sensitizing Dye]

A bis(4-carboxy-4'-tetrabutylammoniumcarboxy-2,2'-bipyridine)diisothiocyanate ruthenium complex, generally referred to as N719 dye, (produced by Solaronix SA) was used as the sensitizing dye 4. The porous titanium oxide semiconductor electrode was immersed in an anhydrous ethanol solution having a dye concentration of 0.4 mmol/L, and allowed to stand over night while shielded from light. Thereafter, the excessive dye was washed off with anhydrous ethanol, and the electrode was dried in the air to provide the semiconductor electrode of the solar cell.

[Production of Counter Electrode]

FTO glass (produced by Nippon Sheet Glass Co., Ltd., sheet resistance: ≦10Ω per square) was used as the electrode substrate 7. A reaction solution containing 3,4-ethylenedioxythiophene (Baytron MV2, a trade name, produced by H.C. Starck GmbH) as the monomer for the electroconductive polymer, iron (III) tris-p-toluenesulfonate as the oxidizing agent, and N-methyl-2-pyrrolidone (NMP) dissolved in n-butanol at a weight ratio of 1/9/1.6 was coated on the electrode substrate having been rinsed in an organic solvent by a screen printing method. The size of the coated area was 5 mm×10 mm, which was the same as the working electrode. The monomer concentration of 3,4-ethylenedioxythiophene in the solution was 5% by weight. Subsequently, the electrode substrate having the solution coated was heated by placing in a thermostatic chamber maintained at 110° C. for 5 minutes for performing polymerization, and the coated film was the rinsed with methanol and then dried to produce the electroconductive polymer thin film 6. The electroconductive polymer thin film 6 thus produced had a thickness of approximately 0.4 μm.

[Fabrication of Solar Cell]

The semiconductor electrode and the electroconductive polymer electrode, which had been produced as above, were disposed to face each other, and the electrodes were impregnated with an electrolyte therebetween by capillarity. The electrolyte used was a solution containing 0.15 mol/L of iodine, 0.8 mol/L of 1-methyl-3-propylimidazolium iodide, 0.1 mol/L of guanidine thiocyanate and 0.5 mol/L of N-methylbenzimidazole as solutes.

[Production of Specimen of Electroconductive Polymer Thin Film for evaluating Electroconductivity]

For evaluating the electroconductivity of the electroconductive polymer film 6, an electroconductive thin film was produced on slide glass in the same manner. The thin film was in a rectangular shape with a size of 1 cm×2 cm, and 30 sheets of specimens were continuously produced from the same solution.

Comparative Example 1

An electroconductive polymer thin film 6 and a solar cell were produced in the same manner as in Example 1 except that in the production method of the electroconductive polymer thin film 6, dimethylsulfoxide (DMSO) was used as the polymerization controlling agent. The electroconductive polymer thin film thus produced had a thickness of approximately 0.4 μm.

Comparative Example 2

An electroconductive polymer thin film 6 and a solar cell were produced in the same manner as in Example 1 except that in the production method of the electroconductive polymer thin film 6, imidazole was used as the polymerization controlling agent. The electroconductive polymer thin film thus produced had a thickness of approximately 0.4 μm.

Comparative Example 3

A solar cell were produced in the same manner as in Example 1 except that as the production method of the electroconductive polymer thin film 6, a poly(3,4-ethylenedioxythiophene)-polystyrenesulfonic acid aqueous dispersion liquid (Baytron P, produced by H.C. Starck GmbH) was spin-coated on FTO glass under conditions of 2,000 rpm over 30 seconds, and then dried in the air and dried under heating to 110° C. for 5 minutes, thereby forming an electroconductive polymer thin film. The electroconductive polymer thin film thus produced had a thickness of approximately 0.3 μm.

Comparative Example 4

A solar cell were produced in the same manner as in Example 1 except that FTO glass was used as the electrode substrate 7 of the counter electrode 9, and a platinum counter electrode produced by forming a platinum layer on the FTO glass by a sputtering method. The platinum layer thus produced had a thickness of approximately 0.15 μm.

[Evaluation of Photoelectric Conversion Efficiency of Solar Cell]

The solar cells produced in Example and Comparative Examples were evaluated for photoelectric conversion efficiency in the following manner.

In the evaluation of capability, the load characteristics (I-V characteristics) was evaluated with a potentiostat under an irradiation condition of 100 mW/cm$^2$ with Solar Simulator XES-502S with xenon lamp (available from Kansai Scientific Machines Co., Ltd.) equipped with an AM filter after spectral adjustment of AM 1.5 G. The evaluation values of a solar cell include an open circuit voltage Voc (mV), a short circuit electric current density Jsc (mA/cm$^2$), a form factor FF (no unit) and a conversion efficiency η (%), and larger values of the measured values show favorable capabilities of a solar cell. The measurement results are shown in Table 1.

[Evaluation of Electroconductivity of Electroconductive Polymer Thin Film]

A specimen of the electroconductive polymer thin film produced in the manner shown in Example or Comparative Examples placed on slide glass was measured for sheet resistance with a four-probe low resistivity meter (Loresta GP, produced by Mitsubishi Chemical Co., Ltd.). The minimum value, the maximum value and the average value of the measurement results of the 30 specimens for each film are shown in Table 2.

TABLE 1

| | Open circuit voltage Voc (mV) | Short circuit electric current density Jsc (mA/cm²) | Form factor FF | Conversion efficiency η (%) |
|---|---|---|---|---|
| Example 1 | 712 | 16.9 | 0.681 | 8.2 |
| Comparative Example 1 | 702 | 16.4 | 0.662 | 7.6 |
| Comparative Example 2 | 705 | 16.2 | 0.661 | 7.5 |
| Comparative Example 3 | 700 | 15.1 | 0.320 | 3.4 |
| Comparative Example 4 | 710 | 16.9 | 0.683 | 8.2 |

TABLE 2

| | Sheet resistance of electroconductive polymer thin film (Ω per square) | | |
|---|---|---|---|
| | Minimum value | Maximum value | Average |
| Example 1 | 35 | 48 | 40 |
| Comparative Example 1 | 57 | 98 | 60 |
| Comparative Example 2 | 105 | 130 | 115 |
| Comparative Example 3 | ≦8,000 | ≦15,000 | ≦10,000 |

It is apparent from the results in Table 1 that the solar cell device of Example 1 using the counter electrode formed of the PEDOT-PTS thin film produced with NMP as a polymerization controlling agent shows higher device conversion efficiency than Comparative Example 1 to 3, i.e., the solar cell devices using the electroconductive polymer counter electrodes produced by the known methods and materials, and shows device conversion efficiency that is equivalent to the device of Comparative Example 4 using the platinum counter electrode. It is understood from the results that under the high performance device condition of Jsc>15 mA/cm² and η>8%, the electroconductive polymer thin film electrode used in Example 1 has capabilities that are equivalent to the conventional platinum counter electrode shown in Comparative Example 4.

It is found from the results shown in Table 2 that Example 1 using N-methyl-2-pyrrolidone (NMP) as the polymerization controlling agent has a low sheet resistance and suffers less fluctuation in sheet resistance as compared to Comparative Examples 1 to 3 using dimethylsulfoxide (DMSO) or imidazole as the polymerization controlling agent. It can be said that NMP has high capability as a polymerization controlling agent as compared to DMSO and imidazole.

When polymerization proceeds at room temperature in a coating solution before polymerization, there is a tendency that the sheet resistance of the electroconductive thin film after coating and forming under heat is increased. In Example 1, the sheet resistances of the 30 specimens of the sheet are small and suffer less fluctuation, and it is understood therefrom that the use of NMP as a polymerization controlling agent effectively prevents polymerization in the solution under room temperature condition. The phenomenon provides an advantage on practicing a coating method requiring stability of a coating solution, such as a screen printing method.

It is understood from Table 2 that a specimen having a lower sheet resistance of the electroconductive polymer thin film has a higher device photoelectric conversion efficiency shown in Table 1. It is understood therefrom that the electroconductive polymer thin film having higher electroconductivity enhances the photoelectric conversion efficiency of the device although it is influenced in certain extent by the characteristics of the electroconductive glass used as the electrode substrate. Accordingly, it can be said that the method of the invention capable of producing efficiently a specimen having a low sheet resistance is excellent as a production method of a counter electrode of a dye-sensitized solar cell, as compared to the conventional methods.

It is understood from the aforementioned results that the electroconductive polymer electrode of the invention is excellent in electroconductivity and catalyst capability, can be applied to a printing method and can be easily patterned owing to the high stability of the polymerization solution, and can be produced with good reproducibility and productivity, and the dye-sensitized solar cell equipped with the electroconductive polymer electrode has excellent characteristics.

According to the method for producing an electroconductive polymer electrode of the invention, a dye-sensitized solar cell having high capability is provided at low cost. The electroconductive polymer electrode can be applied to, in addition to a dye-sensitized solar cell, a photoelectric conversion device, such as an organic solar cell and an optical sensor, a light emitting device, such as an organic EL device and an inorganic EL device, and an energy device, such as a fuel cell and an electric double layer capacitor.

The invention claimed is:

1. A method for producing an electroconductive polymer electrode comprising steps of:
   coating a solution containing a monomer of an electroconductive polymer and an oxidizing agent on an electrode substrate, said coating step comprising screen printing said solution; and
   then polymerizing the monomer by oxidation polymerization to form an electroconductive polymer thin film,
   wherein the solution contains a pyrrolidone compound having the following general formula (1) as a polymerization controlling agent:

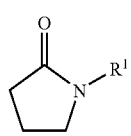

(1)

wherein in the formula (1), $R^1$ is an alkyl group or an aryl group.

2. The method for producing an electroconductive polymer electrode according to claim 1, wherein the pyrrolidone compound comprises N-methyl-2-pyrrolidone.

3. A dye-sensitized solar cell comprising a semiconductor electrode having a photoelectric conversion layer, and a counter electrode facing the semiconductor electrode, the counter electrode being an electroconductive polymer electrode produced by a method comprising:
   coating a solution containing a monomer of an electroconductive polymer and an oxidizing agent on an electrode substrate; and then polymerizing the monomer by oxidation polymerization to form an electroconductive polymer thin film, wherein
   the solution contains a pyrrolidone compound having the following general formula (1) as a polymerization controlling agent:

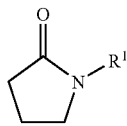 (1)

wherein in the formula (1), $R^1$ is an alkyl group or an aryl group.

4. The dye-sensitized solar cell according to claim 3, wherein the electroconductive polymer thin film has a sheet resistance of 60Ω per square or less.

5. The dye-sensitized solar cell according to claim 3, wherein the pyrrolidone compound comprises N-methyl-2-pyrrolidone.

6. The dye-sensitized solar cell according to claim 3, wherein said coating step comprises printing.

7. The dye-sensitized solar cell according to claim 6, wherein said printing comprises screen printing.

8. The dye-sensitized solar cell according to claim 5, wherein said coating step comprises printing.

9. The dye-sensitized solar cell according to claim 8, wherein the printing comprises screen printing.

10. The dye-sensitized solar cell according to any of claim 5, 6, 7, 8 or 9, wherein the electroconductive polymer thin film has a sheet resistance of 60Ω per square or less.

* * * * *